United States Patent
Mitsumura et al.

(10) Patent No.: US 12,515,953 B2
(45) Date of Patent: Jan. 6, 2026

(54) SILICON NITRIDE SINTERED SUBSTRATE

(71) Applicant: TOKUYAMA CORPORATION, Shunan (JP)

(72) Inventors: Norihira Mitsumura, Shunan (JP); Dai Kusano, Shunan (JP); Hideaki Kawai, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 489 days.

(21) Appl. No.: 18/013,662

(22) PCT Filed: Jun. 29, 2021

(86) PCT No.: PCT/JP2021/024643
§ 371 (c)(1),
(2) Date: Dec. 29, 2022

(87) PCT Pub. No.: WO2022/004755
PCT Pub. Date: Jan. 6, 2022

(65) Prior Publication Data
US 2023/0357010 A1    Nov. 9, 2023

(30) Foreign Application Priority Data
Jun. 30, 2020  (JP) .................................. 2020-112367

(51) Int. Cl.
*C01B 21/068* (2006.01)
*H01L 23/15* (2006.01)
*H05K 1/03* (2006.01)

(52) U.S. Cl.
CPC ............ *C01B 21/068* (2013.01); *H01L 23/15* (2013.01); *C01P 2006/16* (2013.01); *H05K 1/0306* (2013.01)

(58) Field of Classification Search
None
See application file for complete search history.

(56) References Cited

U.S. PATENT DOCUMENTS

| | | | |
|---|---|---|---|
| 6,846,765 | B2 | 1/2005 | Imamura et al. |
| 2002/0084103 | A1* | 7/2002 | Komatsu ................. H01L 23/15 |
| | | | 257/E23.009 |

(Continued)

FOREIGN PATENT DOCUMENTS

| | | |
|---|---|---|
| CN | 1356292 A | 7/2002 |
| CN | 110049946 A | 7/2019 |

(Continued)

OTHER PUBLICATIONS

International Search Report for PCT/JP2021/024643 (PCT/ISA/210) mailed on Sep. 7, 2021.

(Continued)

*Primary Examiner* — John J Figueroa
(74) *Attorney, Agent, or Firm* — Birch, Stewart, Kolasch & Birch, LLP

(57) ABSTRACT

The present invention provides a silicon nitride sintered substrate capable of reducing contamination caused by a boron nitride powder or the like used as a releasing agent and problems in bonding strength and dielectric strength at the time of laminating metal layers or the like, where the contamination is caused by a network structure provided by a silicon nitride crystal formed on the surface of the substrate in an unpolished state after sintering a silicon nitride powder. The silicon nitride substrate in an unpolished state after sintering is a silicon nitride sintered substrate where a cumulative volume of pores having a diameter in a range of 1 to 10 μm is not more than $7.0 \times 10^{-5}$ mL/cm$^2$ in a measurement by a mercury porosimetry. Preferably, Ra of the surface is not more than 0.6 μm and arithmetic mean peak curvature (Spc) of a peak is not more than 4.5 [1/mm].

11 Claims, 1 Drawing Sheet

(56) References Cited

U.S. PATENT DOCUMENTS

| | | | |
|---|---|---|---|
| 2002/0164475 A1 | 11/2002 | Imamura et al. | |
| 2004/0076806 A1 | 4/2004 | Miyanaga et al. | |
| 2016/0251223 A1* | 9/2016 | Nakayama | H01L 23/3735 428/209 |
| 2018/0002237 A1* | 1/2018 | Aoki | C04B 35/584 |
| 2020/0399125 A1 | 12/2020 | Wakamatsu | |
| 2023/0106510 A1* | 4/2023 | Takeda | C04B 38/0038 252/74 |

FOREIGN PATENT DOCUMENTS

| | | |
|---|---|---|
| CN | 110062745 A | 7/2019 |
| JP | 2002-128569 A | 5/2002 |
| JP | 2002-201076 A | 7/2002 |
| JP | 2012-218983 A | 11/2012 |
| JP | 2013-182983 A | 9/2013 |
| WO | WO 2018/110564 A1 | 6/2018 |
| WO | WO 2019/167879 A1 | 9/2019 |

OTHER PUBLICATIONS

Japanese Society of Marine Engineers, Journal of the Marine Engineering Society in Japan, Sep. 1993, vol. 28, Issue 9, pp. 548-556.

Extended European Search Report issued in European Application No. 21833222.9 on Jun. 3, 2025.

Chinese Office Action and Search Report for corresponding Chinese Application No. 202180044279.1, dated Apr. 14, 2023.

* cited by examiner

SILICON NITRIDE SINTERED SUBSTRATE

TECHNICAL FIELD

The present invention relates to a novel silicon nitride sintered substrate. Specifically, the present invention provides a silicon nitride sintered substrate having extremely small volume of pores of a specific size present on a surface in an unpolished state after sintering so that contamination caused by a releasing agent used for preventing fusion during firing is reduced remarkably.

BACKGROUND ART

A silicon nitride sintered compact is obtained by adding any of various sintering additives to a silicon nitride powder and sintering at a high temperature. The thus obtained silicon nitride sintered compact is lightweight and characterized for instance in mechanical strength at temperature ranging from normal temperature to high temperature, excellent chemical resistance and electrical insulation in various ceramics sintered compacts, and thus, it has been used for wear-resistant members such as ball bearings and high-temperature structural members. Furthermore, since the thermal conductivity can also be improved by modifying the type of the additive and sintering conditions, nowadays, the silicon nitride sintered substrate is used also as a thin and strong substrate material for heat dissipation.

It has been known that the crystal forms of silicon nitride powder include an α-type and a β-type. For instance, an α-type silicon nitride powder is re-precipitated as a β-type in the sintering process so as to provide a dense sintered compact with a high thermal conductivity. For this reason, it has been widely used recently (see Non-Patent Document 1).

In a case of using an α-type silicon nitride powder in order to produce a silicon nitride sintered substrate, the β-type grows into large crystals. Though this may serve to densify the interior, many pores are formed on the surfaces due to the network structure formed by the grown needle-like crystals. Usually, a silicon nitride sintered substrate is used in an unpolished state after sintering. Namely, a sintered compact obtained by firing is blasted to remove deposits like a releasing agent present on the surface, and used directly as a substrate.

Silicon nitride sintered substrates obtained by firing the α-type silicon nitride powder as a main component have been used as laminated substrates for semiconductors. Such a substrate includes a laminate of metal layer or the like while some deposits after firing remain in the pores, and a representative example of the deposits is boron nitride used commonly as the releasing agent. As for the substrate, there is a concern that the heat cycle resistance may deteriorate, or malfunctions of the semiconductor may occur.

Further, since the boron nitride is present in the network structure on the surface in production of the silicon nitride sintered substrate, reportedly the thus obtained silicon nitride sintered substrate tends to be waved or warped.

A laminated substrate prepared by laminating a metal layer or the like on the silicon nitride substrate based on the α-type silicon nitride powder as a main component has a porous surface due to the network structure. Therefore, the surface is rough, and thus, a direct bonding is difficult. In this case, therefore, a brazing material or grease may be used for lamination. Though the network structure exhibits an anchoring effect, bubbles may often remain in the network structure and degrade the bonding strength or dielectric strength of the laminated substrate. Another disadvantage is that excessive amount of brazing material is required for filling the network-shape layer.

Another technique for producing a sintered compact based on the β-type silicon nitride powder as a main component is also proposed (see Patent Document 1). In an example thereof, a green sheet (compact to be fired) comprising β-type silicon nitride powder having an average particle diameter of 0.5 μm and a sintering additive composed of ytterbium oxide and silicon magnesium nitride powder is sintered at 1900° C. for 2 to 24 hours in pressurized nitrogen of 10 atm to obtain the silicon nitride sintered compact.

In the method, firing is performed in pressurized nitrogen. As a result, even when the β-type silicon nitride is used as the main component, crystal growth is achieved at the time of sintering, so that a sintered compact of the substantially same level as a sintered compact based on the α-type silicon nitride will be obtained. However, the technique may not solve the problem caused by the network structure formed on the surface due to the crystal growth.

PRIOR ART DOCUMENTS

Patent Documents

Patent document 1: JP 2002-128569A.

Non-Patent Document

Non-Patent Document 1: Japanese Society of Marine Engineers, September 1993, Vol. 28, No. 9, p 548-556

SUMMARY OF THE INVENTION

Problem to be Solved by the Invention

Accordingly, an object of the present invention is to provide a silicon nitride sintered substrate capable of reducing contamination and problems in bonding strength and dielectric strength at the time of laminating metal layers or the like. The contamination is caused by a network structure due to a silicon nitride crystal formed on the surface of the substrate in an unpolished state after sintering a silicon nitride powder.

Means for Solving the Problems

The present inventors have made extensive studies to solve the problems. According to their findings, the problems of contamination caused by the releasing agent and voids due to the brazing materials in the laminate comprising the metal layer or the like are caused by pores of certain sizes formed due to the network structure of the silicon nitride crystals on the surface area of the sintered compact. Based on the findings, the present inventors further studied. Finally, they used a specific β-type silicon nitride powder and employed specific firing conditions so as to appropriately control the crystal growth at the time of sintering by firing. This prevents or reduces formation of the network structure of the silicon nitride crystal on the surface area by the sintering, and remarkably reduces pores of a specific size that may cause contamination or the like. In this manner, the present inventors obtained the silicon nitride sintered substrate with a very small number of pores of a specific size, and thus, they arrived at the present invention.

That is, the present invention provides a silicon nitride sintered substrate that is sintered and remains unpolished, wherein a cumulative volume of pores having a diameter in a range of 1 to 10 μm is not more than $7.0\times10^{-5}$ mL/cm$^2$ in a measurement by a mercury porosimetry.

Since the number of the specific pores is small, the silicon nitride sintered substrate of the present invention has an extremely smooth surface property, namely, Ra of the surface is not more than 0.6 μm and arithmetic mean peak curvature (Spc) of a peak is not more than 4.5 [1/mm].

It is preferable for the silicon nitride sintered substrate of the present invention that crystal grains are observed in a viewing field range in the depth of not less than 50 μm from the surface in a micrograph of a randomly selected cross section taken with a 2000× scanning electron microscope, and the crystal grains have an internal structure where a maximum major axis is not more than 10.0 μm, an average major axis is in a range of 1.5 to 2.0 μm, and a ratio of major axis to minor axis (major axis/minor axis) is in a range of 1 to 5.

It is further preferable that the silicon nitride sintered substrate of the present invention has a thickness in the range of 0.1 to 1.5 mm.

Furthermore, the present invention can provide a silicon nitride sintered substrate characterized in that the concentration of boron element measured by fluorescence X-ray analysis is less than the detection limit, and the feature is imparted by the aforementioned surface properties.

The present invention provides also a laminated substrate for semiconductor, which is obtained using the silicon nitride sintered substrate described above.

Effect of the Invention

The silicon nitride sintered substrate of the present invention, which is obtained by sintering a silicon nitride powder, has a very small number of pores of a specific size in an unpolished state after the sintering. Therefore, contamination of the substrate caused by a boron powder used as a releasing agent can be reduced remarkably, and thus, heat cycle resistance degradation or occurrence of malfunction of the semiconductor can be prevented or reduced. As a result, the substrate can be used favorably for semiconductors. Another advantage is that the substrate can be obtained as a flat sintered substrate free from waviness or warpage.

In lamination of the metal layer or the like, bubbles generated at the time of coating the blazing material may cause degradation in the bonding strength and dielectric strength. In the present invention, it is possible to effectively prevent such problems and furthermore, drastically reduce the use amount of the blazing material, and thus, lamination with favorable adhesiveness can be performed. In addition to that, the smooth surface allows forming the metal layer directly on the laminate surface without using the blazing material.

MODE FOR CARRYING OUT THE INVENTION

[Silicon Nitride Sintered Substrate]

Figure 1:
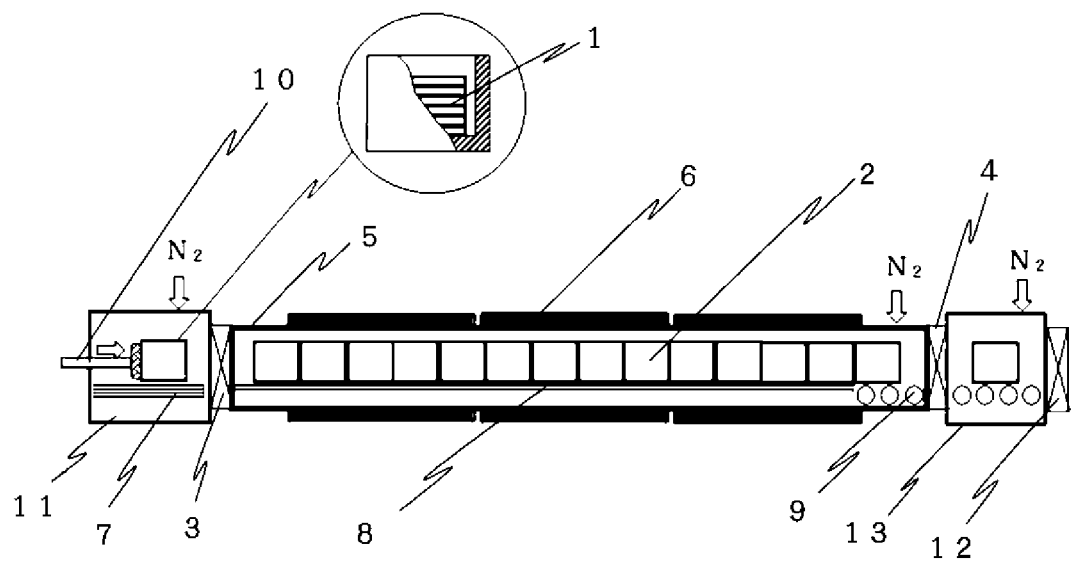
FIG. 1 is a schematic view showing an embodiment of a continuous firing furnace, which is used to perform continuous firing in the present invention.

A silicon nitride sintered substrate of the present invention is a silicon nitride sintered substrate in an unpolished state after sintering. In the substrate, a cumulative volume of pores having a diameter in a range of 1 to 10 μm is not more than $7.0\times10^{-5}$ mL/cm$^2$, preferably, not more than $4.0\times10^{-5}$ mL/cm$^2$ in a measurement by a mercury porosimetry.

Hereinafter, a pore to be measured by the mercury porosimetry, which has a pore diameter in a range of 1 to 10 μm, may be called "specific pore".

In the present invention, the pore cumulative volume is obtained by the measurement method shown in Example described later.

In the present invention, "a state unpolished after firing" means a state of a silicon nitride sintered substrate obtained by sintering a silicon nitride powder but not being subjected to a polishing process for smoothing the surface.

However, preferably blasting is performed after the sintering. Blasting is usually performed in conventional techniques in order to remove foreign matters such as a releasing agent adhering to the surface. For the blasting, any known process can be employed without any particular limitations as long as the foreign matters can be removed. For instance, a fluid containing abrasive grains is impinged against the surface of the silicon nitride sintered substrate after sintering, in either wet or dry process. Specifically in a dry process, it is usual that an airflow containing abrasive grains having an average particle size of 400 to 800 μm and hardness of the substantially same level as that of alumina is got impinged against the surface of the silicon nitride sintered substrate at an impingement pressure of about 0.2 to about 0.4 MPa.

The present inventors have confirmed through experiments that the specific pores are not affected substantially by the blasting process performed for removing foreign matters.

The present inventors conducted investigations of commercially available silicon nitride sintered substrates and found that the cumulative volume of the specific pores of the substrates unpolished after sintering is larger by one order of magnitude than that of the silicon nitride sintered substrate of the present invention. This result indicates that the silicon nitride sintered substrate of the present invention is characterized in its surface properties, i.e., the cumulative volume of such specific pores is extremely small.

The surface properties allow to provide a so-called "boronless" silicon nitride sintered substrate, that is, substantially any releasing agent (specifically, boron nitride powder) used at sintering will not remain in the pores.

Further, since the silicon nitride sintered substrate of the present invention has extremely small cumulative volume of the specific pores, bubbles may hardly remain in the network structure even in production of the laminated substrate by use of the brazing material, and thus, it is possible to produce a laminated substrate having high dielectric strength.

In the present invention, there is no particular limitation on the cumulative volume for pores other than the specific pores. For instance, a cumulative volume of pores of 1 to 100 μm may be in the range of $2.0\times10^{-4}$ mL/cm$^2$ to $8.0\times10^{-4}$ mL/cm$^2$. Irrespective of the pore volume, the particular pore volume falls within the aforementioned range. In contrast, in a case of a commercially available silicon nitride sintered substrate, the cumulative volume of the specific pores is a value much smaller than the range of the counterpart in the present invention, even if the cumulative volume of pores of 1 to 100 μm falls within the range. This indicates that the cumulative volume of specific pores is not to be compared with any other pore cumulative volume.

The silicon nitride sintered substrate of the present invention can be obtained by a method described later. The substrate has a surface property characterized with specific pores that are extremely small. Alternatively, in addition to the small pores, the surface property is not rough and extremely smooth. The properties serve to improve adhesiveness of the bonding surfaces in a case of laminating a metal layer by using the brazing material or in a case of laminating directly the metal layer.

That is, in the present invention, the silicon nitride sintered substrate preferably has a surface with Ra of not more than 0.6 μm, in particular, not more than 0.5 μm. The value of the arithmetic mean peak curvature of the peak (Spc) is preferably not more than 4.5 [1/mm], and in particular, not more than 4.2 [1/mm].

The values of Ra to indicate the surface roughness and Spc to indicate the condition of the convex portion on the surface are values obtained using a noncontact coordinate measuring machine (trade name: VR-5000 manufactured by KEYENCE CORPORATION), as will be specified later in Example.

Here, Spc will be explained. The arithmetic mean peak curvature Spc represents the average of the principal curvature of the surface peaks. Equation 1 below indicates an expression for calculating the arithmetic mean peak curvature Spc. In Equation 1, z denotes the height-direction component at x and y coordinates, n denotes the number of peaks, and the arithmetic mean peak curvature Spc denotes the average of the reciprocal of the radius of approximate circle of the peak vertices of the surface concavity. The smaller the value, the peak is more rounded and wider.

[Equation 1]

$$Spc = -\frac{1}{2}\frac{1}{n}\sum_{k=1}^{n}\left(\frac{\partial^2 z(x, y)}{\partial x^2} + \frac{\partial^2 z(x, y)}{\partial y^2}\right) \quad (1)$$

The silicon nitride sintered substrate of the present invention has a small Ra as mentioned above, and the Spc value of the surface is also extremely small, namely, not more than 4.5 [1/mm], whereby the silicon nitride sintered substrate of the present invention has a surface with smoother touch in comparison with conventional silicon nitride sintered substrates having Spc values of usually more than 5 [1/mm].

It is also preferable for the silicon nitride sintered substrate of the present invention that in a micrograph of a randomly selected cross section of crystal grains constituting the sintered compact taken with a 2000× scanning electron microscope, the maximum major axis of crystal grains observed in a viewing field range in the depth of not less than 50 μm from the surface is not more than 10.0 μm, in particular, 4.0 to 7.0 μm, the average major axis is 1.5 to 2.0 μm, and the ratio of the major axis to the minor axis (major axis/minor axis) is 1 to 5, in particular, 3 to 5.

Since the properties of the crystal grains inside the substrate may affect also the conditions of the substrate surface, it is favorable for the silicon nitride sintered substrate that the crystal grains inside the substrate are within the aforementioned ranges. That is, when the maximum major axis, the average major axis, or the ratio of the major axis to the minor axis exceeds the range, the cumulative volume of the specific pores tends to increase. When the average major axis or the ratio of the major axis to the minor axis is smaller than the range, the strength of the silicon nitride sintered substrate tends to decrease.

Though the thickness of the silicon nitride sintered substrate of the present invention is not particularly limited, it is usually in the range of 0.1 to 1.5 mm.

As mentioned below, the silicon nitride sintered substrate of the present invention is preferably obtained using a silicon nitride powder containing no aluminum or substantially no aluminum as a starting material or an additive. For this reason, the total aluminum concentration in the sintered substrate is not more than 0.1% by mass, in particular not more than 800 ppm. As for the releasing agent, usually a boron nitride powder is used. In the silicon nitride sintered substrate of the present invention, the surface boron concentration measured by fluorescence X-ray analysis is less than the detection limit after the foreign matter is removed by blasting. When a laminated substrate for semiconductor is formed, the properties serve to effectively prevent or reduce degradation in the heat cycle resistance and malfunction of the semiconductor.

[Method for Producing Silicon Nitride Sintered Compact]

Although the method for producing the silicon nitrate sintered substrates of the present invention is not particularly limited, a typical method is as follows. A green sheet, which contains a silicon nitride powder having a β-phase rate of not less than 90%, a specific surface area in a range of 7 to 20 m²/g, a crystal distortion of not less than $4.0 \times 10^{-4}$ together with a sintering additive, is heated to a temperature in a range of 1200 to 1800° C. in an inert gas atmosphere and under a pressure of not less than 0.1 MPa·G and less than 0.5 MPa·G, thereby sintering the silicon nitride. The total content of aluminum element in the green sheet is adjusted not to exceed 800 ppm.

According to this method, a dense sintering can be carried out at a low pressure and a low temperature, by using a silicon nitride powder having a high β-phase rate, and having a high specific surface area and a high crystal distortion, which are obtained by a specific pulverization as described hereinafter. In this manner, growth of needle-shape crystals on the surface of the silicon nitride sintered substrate is prevented or reduced, and a silicon nitride sintered substrate reliably imparted with excellent properties can be obtained while formation of pores of 1 to 10 μm on the substrate surface is prevented or reduced.

[Method for Producing Silicon Nitride Sintered Compact by Using Continuous Firing Furnace]

Furthermore, a continuous firing furnace is preferably used in the method for producing a silicon nitride sintered compact of the present invention. Specifically, the method comprises: supplying a firing jig housing a green sheet into a continuous firing furnace; and heating to a temperature to a range of 1200 to 1800° C. in an inert gas atmosphere and at a pressure of not less than 0 MPa·G and less than 0.1 MPa·G (hereinafter, such a slightly increased pressure may be also included in the range of "normal pressure"), thereby sintering the silicon nitride. Here, the green sheet contains a silicon nitride powder having a β-phase rate of not less than 80% and a specific surface area of 7 to 20 m²/g together with a sintering additive, where the total content of aluminum element is adjusted not to exceed 800 ppm. And the continuous firing furnace comprises a closed-type firing container having at the both end portions a supplying openable door and a discharging openable door for supplying/discharging the firing jig, a heating mechanism provided on the body periphery of the firing container, a conveyance mechanism for supplying/discharging the firing jig into/from the firing container, and a gas-supplying mechanism for supplying an inert gas into the firing container.

Advantages imparted by use of the continuous firing furnace are as follows. In a case of conventional firing under pressure, it is necessary to use a pressure-resistant container for the production. This may limit the production method in terms of equipment. Namely, the production is usually limited to a batch process, which requires repeated temperature-rising and cooling for every batch, thereby increasing the production cost. However, conditions for sintering at a normal or substantially normal pressure employed in the present invention does not require use of such a pressure-resistant container. This enables a continuous firing that includes a supply of a sintering material into a firing furnace to an ejection of a sintered compact after the firing. Due to the use of such a continuous firing furnace, there is no necessity of raising the furnace's temperature from the room temperature to the firing temperature for every batch, and thus, it is possible to perform sintering with extremely low energy. As a result, the silicon nitride sintered compact can be produced with favorable productivity, which is effective in lowering the production cost.

[Green Sheet]

In the method for producing a silicon nitride sintered substrate of the present invention, the green sheet contains a specific silicon nitride powder and a sintering additive described below.

<Silicon Nitride Powder>

(β-Phase Rate)

The β-phase rate of the silicon nitride powder contained in the green sheet is 80% or more. Since a silicon nitride powder having a β-phase rate of 80% or more can be obtained without setting any strict production conditions, it can be produced at a relatively low cost. That is, use of the silicon nitride powder having a high β-phase rate can reduce the overall cost for producing the silicon nitride sintered compact. Another advantage imparted by setting the high β-phase rate is that it can further reduce the amount of oxygen taken up by the α-type silicon nitride particles for transition to the β-type silicon nitride particles during the firing. Here, the β-phase rate of the silicon nitride powder is preferably 85% or more, and further preferably, 90% or more.

The β-phase rate of the silicon nitride powder means a peak intensity ratio of the β-phase relative to the sum of the α-phase and the β-phase in the silicon nitride powder [100×(peak intensity of β-phase)/(peak intensity of α-phase+peak intensity of β-phase)], and it is determined by powder X-ray diffraction (XRD) measurement using CuKα rays. More particularly, it is determined by calculating the weight ratio of α-phase to β-phase in a silicon nitride powder by the method described in C. P. Gazzara and D. R. Messier: Am. Ceram. Soc. Bull., 56 (1977), 777-780.

(Specific Surface Area)

The specific surface area of the silicon nitride powder is 7 to 20 m$^2$/g. In a case where the specific surface area of the silicon nitride powder exceeds 20 m$^2$/g, it may become difficult to lower the amount of solid solution oxygen. In a case where the specific surface area of the silicon nitride powder is less than 7 m$^2$/g, it may become difficult to obtain a dense and strong silicon nitride sintered compact. The specific surface area of the silicon nitride powder is preferably 12 to 15 m$^2$/g.

In the present invention, the specific surface area means a BET specific surface area measured by using a BET single point method based on nitrogen gas adsorption.

(Crystal Distortion)

The silicon nitride powder used in production of the silicon nitride sintered substrate of the present invention possesses the aforementioned properties and further a crystal distortion of not less than $4.0 \times 10^{-4}$. It has not been clarified how the crystal distortion acts on formation of the network structure on the surface of the obtained silicon nitride sintered substrate, i.e., formation of the pores. The present inventors have confirmed through their experiments that the cumulative volume of the specific pores can be reduced by enlarging the crystal distortion of the silicon nitride powder.

The crystal distortion was measured by the method mentioned in Example.

(Other Physical Properties)

Though the other physical properties of the silicon nitride powder are not particularly limited, for instance, the amount of solid solution oxygen is preferably not more than 0.2% by mass, preferably not more than 0.1% by mass, from the viewpoint of obtaining a silicon nitride sintered compact having high thermal conductivity.

Here, the amount of solid solution oxygen means oxygen solid dissolved inside the particles of the silicon nitride powder (hereinafter, this will be also referred to as internal oxygen), which does not include oxygen derived from an oxide such as $SiO_2$ that is inevitably present on the particle surface (hereinafter, this will also be referred to as external oxygen).

The amount of the solid solution oxygen can be measured by the method described in Example.

Although there is no particular limitation on the method of adjusting the amount of solid solution oxygen in the silicon nitride powder, for instance, a high-purity material may be favorably used in producing the silicon nitride powder. For instance, in a case of producing a silicon nitride powder by a direct nitriding process, it is preferable to use a silicon powder as a raw material having no internal factor to cause solid solution of oxygen. Specifically, it is preferable to use a silicon powder derived from semiconductor-grade silicon. The silicon powder may be a cutting powder generated during a process such as silicon cutting. The semiconductor-grade silicon is typically a polycrystalline silicon obtained by a so-called "Siemens method" in which high-purity trichlorosilane is made react with hydrogen in a Belgian type reaction container.

The average particle diameter $D_{50}$ of the silicon nitride powder is preferably 0.5 to 3 μm, more preferably 0.7 to 1.7 μm. When using such a silicon nitride powder of the average particle diameter, sintering is more likely to proceed. The average particle diameter $D_{50}$ is a value on a 50% volume basis measured by the laser diffraction scattering method.

The proportion of particles of the silicon nitride powder having a particle diameter of not more than 0.5 μm is preferably 20 to 50% by mass, and more preferably 20 to 40% by mass. And the proportion of particles of the silicon nitride powder having a particle diameter of not less than 1 μm is preferably 20 to 50% by mass, and more preferably 20 to 40% by mass. By using a silicon nitride powder having the particle diameter distribution, it is easy to obtain a dense silicon nitride sintered compact having a high thermal conductivity.

The reason therefor is not clear. One theory has it that, unlike the α-silicon nitride particles, the β-silicon nitride particles are hardly dissolved and re-precipitated during firing. Therefore, by keeping the fine particles and the coarse particles in a constant balance in the initial stage of firing, it will be possible to obtain a denser sintered compact.

The total amount of oxygen in the silicon nitride powder is preferably not less than 1% by mass. The total amount of oxygen is the sum of the above-described amount of solid solution oxygen (internal oxygen) and the amount of external oxygen. When the total amount of oxygen is equal to or higher than the lower limit values, an effect is imparted, namely for instance, sintering is easily promoted by silicon oxide or the like on the particle surface.

Even if the total amount of oxygen in the silicon nitride powder is 1% by mass or more, it is possible to improve the thermal conductivity of the sintered compact as long as the amount of solid solution oxygen is equal to or lower than the predetermined value, as mentioned above.

The total amount of oxygen in the silicon nitride powder can be measured by the method described in Example.

The amount of the silicon nitride powder in the green sheet is preferably not less than 70% by mass, and more preferably not less than 80% by mass, on the basis of the total amount of the green sheet.

<Production of Silicon Nitride Powder>

The method for producing the silicon nitride powder is not particularly limited as long as it is a method for obtaining a silicon nitride powder having the above-described properties. Examples of the method for producing a silicon nitride powder include a reduction nitriding method, a direct nitriding method, and an imide decomposition method. In the reduction nitriding method, silicon nitride is generated from a silica powder by flowing a nitrogen gas in the presence of carbon powder. In the direct nitriding method, a silicon powder is made react with nitrogen at a high temperature. And in the imide decomposition method, silicon halide is made react with ammonia. From the viewpoint of easily producing a silicon nitride powder having the above-described properties, the direct nitriding method is preferred, and in particular, a direct nitriding method using a self-combustion method (combustion synthesis method) is further preferred.

The combustion synthesis method is a method of using a silicon powder as a raw material. A part of the material powder is forcibly ignited in a nitrogen atmosphere so as to synthesize silicon nitride by self-heating of the material compound. Since the combustion synthesis method is a known method, JP 2000-264608A, WO2019/167879 and the like can be referred to for this method.

Somewhat large crystal distortion can be obtained by the combustion synthesis method. The crystal distortion can be larger by further pulverization. A preferred example of the pulverization is performed using a vibration ball mill, and the pulverization is preferably performed for 5 to 15 hours.

<Sintering Additive>

In the green sheet to be used in the production of the silicon nitride sintered substrate of the present invention, any known sintering additive can be used without particular limitations. Preferably, a sintering additive containing a compound having no oxygen bond is used to prevent degradation in the thermal conductivity of the obtained silicon nitride sintered substrate.

Preferred examples of the compound having no oxygen bond as described above include a carbonitride-based compound containing a rare earth element or magnesium element (hereinafter, also referred to as a specific carbonitride-based compound) and a nitride-based compound (hereinafter, also referred to as a specific nitride-based compound). By using a specific carbonitride-based compound and a specific nitride-based compound, a silicon nitride sintered compact having a higher thermal conductivity can be obtained more easily and more effectively. More specifically, the specific carbonitride-based compound functions as a getter agent for adsorbing oxygen contained in the silicon nitride powder, and lowers the total amount of oxygen in the silicon nitride sintered compact of the specific nitride-based compound, whereby a silicon nitride sintered compact having a high thermal conductivity can be obtained.

Preferred examples of rare earth element in the carbonitride-based compound include Y (yttrium), La (lanthanum), Sm (samarium), Ce (cerium), and Yb (ytterbium).

Examples of the carbonitride-based compound containing a rare earth element include $Y_2Si_4N_6C$, $Yb_2Si_4N_6C$ and $Ce_2Si_4N_6C$. Among them, from the viewpoint of obtaining easily a silicon nitride sintered compact having a high thermal conductivity, $Y_2Si_4N_6C$ and $Yb_2Si_4N_6C$ are preferred.

An example of carbonitride-based compound containing a magnesium element is $MgSi_4N_6C$. And an example of specific nitride-based compound containing a magnesium element is $MgSiN_2$.

Any one of these specific carbonitride-based compounds and specific nitride-based compounds may be used alone, or two or more of them may be used in combination.

Among these carbonitride-based compounds containing a rare earth element or a magnesium element, particularly preferred compounds and specific nitride-based compounds are $Y_2Si_4N_6C$, $MgSi_4N_6C$ and $MgSiN_2$.

The sintering additive may further contain a metal oxide in addition to the aforementioned compound having no oxygen bond. When the sintering additive contains a metal oxide, sintering of the silicon nitride powder is accelerated, whereby a dense and strong sintered compact can be obtained easily.

Examples of the metal oxides include yttria ($Y_2O_3$), magnesia (MgO), and ceria (CeO). Among them, yttria is preferred. One of the metal oxides can be used alone or two or more of them can be used in combination.

The mass ratio of the compound having no oxygen typically exemplified by the above specific nitride-based compounds to the metal oxide contained in the sintering additive (a compound having no oxygen/a metal oxide) is preferably 0.2 to 4, more preferably, 0.6 to 2. When the ratio falls within the range, a dense silicon nitride sintered compact having a high thermal conductivity can be obtained easily.

The content of the sintering additive in the green sheet is preferably 5 to 20 parts by mass, and more preferably 7 to 10 parts by mass, relative to 100 parts by mass of the silicon nitride powder.

<Binder>

The green sheet can be shaped using a binder. In this case, a composition to be shaped is shaped as a sheet as mentioned below, which is dried as required and degreased under known conditions to remove the binder, and fired to provide a green sheet.

Though the binder is not particularly limited, examples thereof include polyvinyl alcohol, polyvinyl butyral, methylcellulose, alginic acid, polyethylene glycol, carboxy methylcellulose, ethylcellulose, and acrylic resin.

The content of the binder used for producing the green sheet is preferably 1 to 30 parts by mass relative to 100 parts by mass of the silicon nitride powder, and the ratio thereof may be appropriately determined according to the method for shaping.

<Total Content of Aluminum Element>

The total content (mass) of aluminum element in the green sheet is not more than 800 ppm. That is, for the green sheet to be used in the present invention, the amount of aluminum element is considerably reduced, so that a silicon nitride sintered compact having a high thermal conductivity can be obtained. The total content of aluminum element in the green sheet is preferably not more than 700 ppm, more preferably not more than 600 ppm.

[Production of Green Sheet]

There is no particular limitation on the method for producing a green sheet used in the present invention, and examples thereof include a method of shaping a composition by a known shaping means, where the composition for shaping contains at least a silicon nitride powder and a sintering additive. Examples of the known shaping methods include press molding, extrusion, injection, and doctor blading. Among them, doctor blading is particularly suitable.

The composition for shaping may contain also a solvent from the viewpoint of easy handling, easy forming, and the like. The solvent is not particularly limited, and examples thereof include organic solvents such as alcohols and hydrocarbons, and water. In the present invention, water is preferably used. That is, it is preferable to shape a composition for shaping that contains a silicon nitride powder, a sintering additive and water to obtain a green sheet. Water is preferably used for the solvent, as it imposes less load on the environment in comparison with a case where an organic solvent is used.

[Sintering Method]

In the method for producing a silicon nitride sintered compact of the present invention, the green sheet is degreased as required, and then, it is fired under certain conditions, thereby sintering the silicon nitride. In the firing, usually the green sheet is in advance coated with a releasing agent comprising a boron nitride powder. Conditions for the firing will be described below.

The firing is performed in an inert gas atmosphere. Here, the inert gas atmosphere indicates for instance a nitrogen atmosphere or an argon atmosphere.

In the inert gas atmosphere, firing is performed under pressure of not less than 0 MPa·G and less than 0.1 MPa·G. The pressure is preferably not less than 0 MPa·G and not more than 0.05 MPa·G. Here, G at the end of the pressure unit MPa·G indicates a gauge pressure.

Since high pressure is not required, the firing can be carried out in a batch furnace like a muffle furnace or a tubular furnace. Alternatively, it can be carried out in a continuous furnace like a pusher furnace.

The green sheet is fired by heating to a temperature in a range of 1200 to 1800° C. When the temperature is lower than 1200° C., sintering of the silicon nitride may be difficult to proceed. When the temperature is higher than 1800° C., the silicon nitride may be easily decomposed. From this viewpoint, the heating temperature at the time of firing is preferably in a range of 1600 to 1800° C.

The firing time is not particularly limited, but preferably it is in the range of about 3 hours to 20 hours.

In a case of using the binder in formation of the green sheet, preferably the organic components such as the binder are removed in a degreasing step. Though the degreasing conditions are not particularly limited, preferably for instance, the green sheet may be heated to a temperature range of 450 to 650° C. in air or an inert atmosphere such as nitrogen or argon.

The silicon nitride sintered substrate having the remarkable properties can be obtained by performing the firing.

[Sintering Method Using Continuous Firing Furnace]

In the method for producing the silicon nitride sintered compact of the present invention, continuous firing can be performed using a continuous firing furnace.

FIG. 1 is a schematic view showing an embodiment of a continuous firing furnace used for performing a continuous firing of the present invention.

As shown in FIG. 1, a firing jig 2 housing a green sheet 1 is supplied into a continuous firing furnace so as to fire the green sheet, thereby producing a silicon nitride sintered compact. Here, the continuous firing furnace comprises: a closed-type firing container 5 having at the end portions a supplying openable door 3 and a discharging openable door 4 for supplying/discharging the firing jig, a heating mechanism 6 provided on the body periphery of the firing container, a conveyance mechanism for supplying/discharging the firing jig into/from the firing container, and gas-supplying mechanism for supplying an inert gas into the firing container.

The process for performing the aforementioned firing will be explained below for an embodiment where a sintered compact to be formed as the green sheet 1 is shaped as a plate and used as a substrate of a semiconductor device. It is efficient that a plurality of the plate-shape compacts to be fired are laminated and housed in firing jigs so as to be supplied/discharged into/from the continuous firing furnace. As mentioned above, in a case of shaping the green sheet by using a binder, it is preferable that the plates of the compact are laminated before the degreasing. Also preferably, a boron nitride powder is interposed as a releasing agent between the layers. For the firing jig 2, a box-shape container having a side wall, as shown in the enlarged view of FIG. 1, is suitably used. Though not shown, it is preferable that a plate-shape sintered compact of silicon nitride is arranged at the upper and lower ends of the laminates of green sheet, for instance.

As for the continuous firing furnace, the firing container 5 for firing in an inert gas atmosphere does not need to be equipped with any advanced pressure-resistant structure as long as it has a structure to withstand the normal pressure.

For instance, a casing of stainless steel or the like lined with a heat-resistant member, specifically a carbon member, is suitable.

The inert gas atmosphere described above is prepared, for instance, by supplying an inert gas such as a nitrogen gas or an argon gas (hereinafter, nitrogen is referred to as an example) into the firing container 5. The pressure in the firing container is preferably adjusted to not less than 0 MPa·G and less than 0.1 MPa·G. Further preferably, the pressure is not less than 0 MPa·G and not more than 0.05 MPa·G. Here, G at the end of the pressure unit MPa·G indicates a gauge pressure.

In general, the silicon nitride is easily decomposed at the normal or the substantially normal pressure. For this reason, it is impossible to set the firing temperature to be higher than 1800° C. for instance, and thus, it is difficult to obtain a dense silicon nitride sintered compact having a high thermal conductivity. In contrast, according to the producing method of the present invention using the aforementioned specific materials for the green sheet, it is possible to fire at a temperature that can prevent decomposition of the silicon nitride within the aforementioned pressure range, whereby a silicon nitride sintered compact having a high thermal conductivity can be obtained.

The green sheet is fired by heating to a temperature in a range of 1200 to 1800° C. When the firing temperature is lower than 1200° C., sintering of the silicon nitride becomes difficult to proceed. When the temperature exceeds 1800° C., the silicon nitride will be easily decomposed. From such viewpoint, the heating temperature for firing is preferably in a range of 1600 to 1800° C.

The firing container 5 is equipped at its body portion with a heating mechanism 6 for adjusting the temperature inside the container for the purpose of firing. For the heating mechanism 6, usually a carbon heater is used. The heating mechanism 6 is preferably divided into a plurality of zones in the direction that the green sheet travels, and the temperature of each of the zones can be controlled independently, for the purpose of adjusting the temperature profile of the heating rate to the temperature for firing of the inside of firing container 5, keeping the temperature, and cooling from the temperature. In the attached drawing, the heating mechanism 6 is divided into three zones. Alternatively, for more precise temperature setting, the mechanism can be divided into four or more zones, and heating temperature for each zone can be adjusted independently. The ratio of the heating time for each zone can be modified by adjusting the ratio for dividing the heating mechanism 6.

For the conveyance mechanism in the continuous firing furnace, which is used for conveying the firing jig 2 housing the green sheet 1, a mechanism employed for known continuous heating furnaces may be employed without any particular limitations. FIG. 1 illustrates a pusher type conveyance mechanism that sequentially pushes the firing jigs 2 from the inlet side of the firing container 5 inside the firing container 5. Specifically, it comprises a guide plate 8 and a roller 9. The guide plate 8 slides the firing jigs 2 that are pushed in from the inlet side, thereby transferring the jigs in the furnace. And the roller 9 having a driving section (not shown) is provided to eject each firing jig 2 independently from the furnace near the outlet of the firing container 5.

Although there is no particular limitation on the firing time at the heating temperature, preferably, it is set to a range of about 3 to 20 hours at the temperature for the firing. This time period is set by adjusting the conveyance rate by the conveying means and the length or the like of the firing container.

For carrying the firing jig 2 into the firing container 5 in the continuous firing furnace or carrying out therefrom, a supplying openable door 3 and a discharging openable door 4 are arranged respectively at the inlet and the outlet. The doors can be opened and closed separately. At the time of supplying or ejecting the firing jig 2 into/from the firing container 5, the supplying openable door 3 and the discharging openable door 4 open and close in conjunction with the actions of the conveyance mechanism. For the supplying openable door 3 and the discharging openable door 4, any known structures capable of ensuring airtightness in the firing container can be used without any particular limitations.

The continuous firing furnace used in the present invention is equipped with a supplying chamber 11 at the inlet side of the firing container 5. The supplying chamber 11 is partitioned from the firing container 5 by the supplying openable door 3 and provided with equipment for performing nitrogen replacement of the internal space. In the supplying chamber, a carry-in door (not shown) is opened and the firing jig is carried in. The internal space is subjected to nitrogen replacement, and its pressure is adjusted to be substantially equal to that in the firing container 5. After that, the supplying openable door 3 is opened, the firing jig 2 is pushed to be supplied into the firing container. For these operations, a piston cylinder 10 may be provided in the supplying chamber 11. Preferably, the supplying chamber 11 is equipped with the guide plate 7 having a height substantially equal to that of the conveying plane of the firing container so that the firing container 5 can be supplied smoothly into the conveying means.

At the outlet side of the firing container 5, an ejection chamber 13 is provided. The ejection chamber 13 is partitioned from the firing container 5 by the discharging openable door 4, and provided with equipment for performing nitrogen replacement of the internal space. In ejecting the firing jig from the firing container 5, the internal space of the ejection chamber 13 is subjected to nitrogen replacement, the pressure is adjusted to be substantially equal to that in the firing container 5. Then, the discharging openable door 4 is opened to perform operations for ejecting the firing jig 2 to the ejection chamber 13. After that, the discharging openable door 4 is closed, the ejection door 12 is opened to eject the silicon nitride fired compact together with the firing jig from the ejection chamber 13. The aforementioned supplying/discharging of the firing jig 2 into/from the firing container 5 is preferably performed in conjunction so that a predetermined number of firing jigs 2 remain in the firing container.

In this manner, it is possible to continuously fire the silicon nitride sintered compacts by use of the continuous firing furnace.

After firing the silicon nitride substrate of the present invention, the substrate is blasted to remove deposits such as a releasing agent comprising a boron nitride powder, thereby provided as a product.

EXAMPLE

Hereinafter, Example will be described to further specify the present invention, though the present invention is not limited to this Example.

In Example, respective physical properties are measured by the following methods.

(1) β-Phase Rate of Silicon Nitride Powder

The β-phase rate of the silicon nitride powder was determined by powder X-ray diffraction (XRD) measurement using CuKα rays. Specifically, the weight ratio of the α-phase to the β-phase in the silicon nitride powder was calculated by the method described in C. P. Gazzara and D. R. Messier: Am. Ceram. Soc. Bull., 56 (1977), 777-780, thereby determining the β-phase rate.

(2) Specific Surface Area of Silicon Nitride Powder

The specific surface area of the silicon nitride powder was measured using a BET specific surface area analyzer (Macsorb HM model-1201) manufactured by Mountech Co., Ltd., using a BET single point method by nitrogen gas adsorption.

Before performing the specific surface area measurement described above, the silicon nitride powder as the measurement target was subjected to a heat treatment in air at 600° C. for 30 minutes, thereby removing organic matters adsorbed on the powder surface.

(3) Crystal Distortion of Silicon Nitride Powder

Calculation was performed by powder X-ray diffraction (XRD) using CuKα rays in the following manner.

An X-ray diffraction pattern was obtained by scanning 2θ in a range of 15 to 80° in step of 0.02° with an X-ray detector. From the pattern, the integral widths of the respective planes (101), (110), (200), (201) and (210) of the β-phase were calculated, and the integral widths were substituted into Williamson-Hall equation of Equation 2 below. The "2 sin θ/λ" and "β cos θ/λ" in the Equation 2 were plotted respectively as the X-axis and the Y-axis, and the crystal distortion (η) was calculated from the inclination of the straight line obtained by the method of least squares.

$$\beta \cos \theta/\lambda = \eta \times (2 \sin \theta/\lambda) + (1/Dc) \qquad (2)$$

(β: integral width (rad), θ: Bragg angle (rad), η: crystal distortion, λ: X-ray wavelength, Dc: crystal diameter (nm))

(4) Particle Diameter of Silicon Nitride Powder
(i) Pretreatment of Sample

For a pretreatment of the silicon nitride powder as a sample, the silicon nitride powder was fired in air for two hours at a temperature of about 500° C. In some cases of the firing, the amount of oxygen on the surface of the silicon nitride powder is small. In other cases of the firing, the particle surfaces may be covered with a hydrophobic material derived from a grinding aid or the like during pulverization, so that the particles themselves may exhibit hydrophobicity. In such a case, dispersion in water may be insufficient, and measurement of particle diameter with reproducibility may be difficult. To avoid the problem, the silicon nitride powder as the sample is fired in air for several hours at a temperature in the range of about 200° C. to about 500° C. so that the silicon nitride powder is imparted with hydrophilicity, and thus, the powder becomes easily dispersible in an aqueous solvent, making it possible to conduct measurement of particle diameter with high reproducibility. It has been confirmed that there is substantially no influence on the particle diameter to be measured even if the powder is fired in air.

(ii) Measurement of Particle Diameter

Into a beaker (60 mmφ in inner diameter and 70 mm in height) having a marked line of maximum 100 mL, 90 mL of water and 5 mL of sodium pyrophosphate having a concentration of 5% by mass were charged and stirred well. Then, a silicon nitride powder as a sample in an amount of approximately 0.1 g was introduced and dispersed by an ultrasonic homogenizer (US-300E manufactured by NIHONSEIKI KAISHA LTD., chip diameter: 26 mm) at an amplitude of 50% (about 2 amperes) for 2 minutes.

In performing the dispersion, the chip was inserted into the beaker so that the tip end was positioned at the marked line of 20 mL.

Next, for the obtained dispersion liquid of the silicon nitride powder, particle size distribution was measured using a laser diffraction-scattering particle size analyzer (Microtrac MT3300EXII manufactured by MicrotracBEL Corp.). As for the measurement conditions, water (refractive index: 1.33) was selected as the solvent. As for the particles, the refractive index was 2.01, and the particles were permeable and non-spherical. The particle size at which the cumulative curve of the particle size distribution measured by the aforementioned particle diameter distribution measurement becomes 50% is defined as the average particle size (average particle diameter: D50).

(5) Cumulative Volume of Pores of Silicon Nitride Sintered Substrates Measured by Mercury Porosimetry In preparation of samples, twenty sheets of 2×2×(0.04) cm were cut out randomly from a silicon nitride sintered substrate. In order to cancel the influence of press-fitting from the sides, each sample was dipped in a highly viscous resin (epoxy resin) so that the plane periphery of the sample would be positioned under the resin by 0.1 mm, thereby sealing the sides. Here, the highly viscous resin was selected as it would not enter the pores.

For the thus obtained samples, a pore size distribution curve was obtained by using a mercury porosimeter (trade name: AutoPore IV9520 manufactured by Micromeritics Instrument Corporation). A cumulative volume in a predetermined range was obtained from the curve, and indicated as an average value of the samples.

(6) Ra and Spc of Silicon Nitride Sintered Substrate

Here, the values specified by the International Standard ISO 25178 Surface Properties (Surface Roughness Measurement) is used. That is, Ra and Spc are the values obtained by measuring randomly-selected evaluation areas of a silicon nitride sintered substrate in a range of 1000 μm×1000 μm using a noncontact 3D measurement system (trade name: VR-5000 manufactured by Keyence Corporation). Specifically, an area of 2 cm×2 cm was determined randomly, and at least twenty evaluation areas of 1000 μm×1000 μm in the area of 2 cm×2 cm were measured, and the average of the thus obtained measurement values was shown.

(7) Measurement of Major and Minor Axes of Crystal Grains of Silicon Nitride Sintered Substrate Micrographs of randomly selected five cross sections of the silicon nitride sintered substrate were taken using a 2000× scanning electron microscope. In the micrographs, the major axis and the minor axis of the crystal grains observed in a viewing field range in the depth of 50 μm or more from the surface were measured, whereby the maximum major axis, the average major axis, and the major axis/minor axis ratio were determined.

(8) Thermal Conductivity of Silicon Nitride Sintered Substrate

The thermal conductivity of the silicon nitride sintered compact was measured by a laser flash analysis using a LFA-502 manufactured by KYOTO ELECTRONICS MANUFACTURING CO., LTD. A thermal conductivity is determined by multiplication of the thermal diffusivity, the sintered compact density, and the specific heat of the sintered compact. For the specific heat of the silicon nitride sintered compact, a value of 0.68 (J/g·K) was employed. Density of the sintered compact was measured using an automatic hydrometer (DMA-220H model, manufactured by SHINKO DENSHI CO., LTD.).

Before the measurement of the thermal conductivity, the surface of the silicon nitride sintered compact was blasted and coated with Au and carbon.

(9) Dielectric Breakdown Voltage of Silicon Nitride Sintered Substrate

The dielectric breakdown voltage was measured according to JISC2110. Specifically, using a dielectric strength measuring device ("TK-O-20K" manufactured by KEISOKU GIKEN Co., Ltd.), voltage was applied to the silicon nitride sintered substrate, thereby measuring the voltage at the time the dielectric breakdown occurred.

(10) Total Content of Aluminum Element in Silicon Nitride Sintered Substrate

The total content of aluminum element in the silicon nitride sintered substrate was measured using an inductively coupled plasma-optical emission spectrometer ("iCAP6500DUO" manufactured by Thermo Fisher Scientific Incorporated).

(11) Content of Boron Element on Silicon Nitride Sintered Substrate Surface

The boron element content on the silicon nitride sintered substrate surface was measured using a fluorescence X-ray spectrometer (ZSX PrimusIV manufactured by Rigaku Corporation).

In the measurement, the detection limit for boron element is 0.7% by mass.

(12) Evaluation of Metallization Properties

A copper plate was bonded to the silicon nitride sintered substrate so as to evaluate the metallization properties. Metallization substrates were prepared using AMB (Active Metal Brazing) or DBC (Direct Bonded Copper) method. In the AMB method, a brazing material (Ag—Cu—Ti 75:21:4 (mass ratio)) containing an active metal was screen-printed on the both surfaces of the silicon nitride substrate. Copper plates having a thickness of 0.3 mm were placed on the substrate, and the substrate was heated in vacuum at 850° C.

for 20 minutes. Thereafter, the substrate was immersion-etched in an aqueous solution of ferric chloride for patterning, whereby a predetermined pattern was formed. Further, for eliminating the remaining composites, the copper plate portion was immersion-etched in an aqueous solution of ammonium hydrogen difluoride, and then, washed with water, thereby preparing a metallization substrate. In the DBC method, copper plates (thickness: 0.3 mm) were placed on the both surfaces of the silicon nitride substrate, and the substrate was held in an inert atmosphere for 10 minutes at an eutectic temperature of 1070° C. or higher, thereby bonding via an eutectic compound. Thereafter, the substrate was immersion-etched in an aqueous solution of ferric chloride for patterning, whereby a predetermined pattern was formed. Further, for eliminating the remaining composites, the copper plate portion was immersion-etched in an aqueous solution of ammonium hydrogen difluoride, and then, washed with water, thereby preparing a metallization substrate.

The metallization substrates obtained by the respective methods were then subjected to a heat cycle test (−40° C. to 200° C.).

The heat cycle test was performed using 10 samples, and a visual evaluation was performed in accordance with the following criteria.

○: None of the 10 samples are cracked or delaminated.
Δ: 1 to 9 samples are cracked or delaminated.
x: All of the 10 sample are delaminated.

The following raw materials were used in Example and Comparative Example.

<Silicon Nitride Powder>

Silicon nitride powders A and B shown in Table 1 were prepared. These were produced by the following method.

(Production of Silicon Nitride Powder A)

A silicon powder (semiconductor-grade, average particle diameter: 5 μm) and a silicon nitride powder as a diluent (average particle diameter: 1.5 μm) were mixed to obtain a raw material powder (Si: 80% by mass, $Si_3N_4$: 20% by mass). The raw material powder was filled in a reaction container so as to form a raw material powder layer. Next, the reaction container was placed in a pressure-resistant closed-type reactor equipped with an igniter and a gas-supplying/discharging mechanism. After degassing inside the reactor by reducing the pressure, a nitrogen gas was supplied therein, and nitrogen replacement was performed. Later, the nitrogen gas was gradually supplied to raise the pressure to 0.7 MPa. At the time a predetermined pressure was achieved (at the time of ignition), the bulk density of the raw material powder was 0.5 g/cm³.

Thereafter, the end portion of the raw material powder in the reaction container was ignited for performing a combustion synthesis reaction to obtain clumps of silicon nitride. The obtained clumps were crushed by rubbing against each other. Then, a certain amount thereof was introduced into a vibration ball mill for performing fine pulverization for 6 hours. For prevention of heavy metal pollution, the interior of the pulverizer was lined with urethane, and balls based on silicon nitride were used for the pulverization media. Immediately before the start of fine pulverization, 1% by mass of ethanol as a grinding aid was added, and fine pulverization was performed in a closely-sealed pulverizer until the crystal distortion was as shown in Table 1 was observed, thereby obtaining a silicon nitride powder. Measurement results for the obtained silicon nitride powder are shown in Table 1.

(Silicon Nitride Powder B)

For the silicon nitride powder B, a commercially available α-type silicon nitride powder having the properties shown in Table 1 was used.

TABLE 1

|  | Silicon nitride powder A | Silicon nitride powder B |
|---|---|---|
| β-phase rate (%) | 99 | 1 or less |
| Solid solution oxygen amount (% by mass) | 0.08 | — |
| Specific surface area (m²/g) | 8.4 | 10.2 |
| Crystal distortion | $5.4 \times 10^{-3}$ | $3.3 \times 10^{-4}$ |
| Total oxygen amount (% by mass) | 1.92 | 1.20 |
| Average particle diameter D50 (μm) | 1.2 | 0.6 |

<Sintering Additive>

A $Y_2Si_4N_6C$ powder was prepared from yttria (manufactured by Shin-Etsu Chemical Co., Ltd.), a silicon nitride powder obtained by the aforementioned method and a carbon powder (manufactured by Mitsubishi Chemical Corporation), by a synthesis with heat in accordance with the following reaction formula.

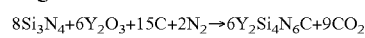

$$8Si_3N_4+6Y_2O_3+15C+2N_2 \rightarrow 6Y_2Si_4N_6C+9CO_2$$

A $MgSiN_2$ powder was prepared from a magnesium powder (Yamaishi Metal Co., Ltd.), a silicon nitride powder obtained by the aforementioned method and a metallic silicon powder (a product possessed by the present Applicant), by a synthesis with heat in accordance with the following reaction formula.

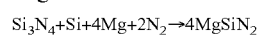

$$Si_3N_4+Si+4Mg+2N_2 \rightarrow 4MgSiN_2$$

The Yttria ($Y_2O_3$) powder was a product of Shin-Etsu Chemical Co., Ltd.

<Binder>

For a binder, a polyvinyl alcohol resin (JAPAN VAM. POVAL CO., LTD.) was used.

Example 1

100 parts by mass of silicon nitride powder A, 2 parts by mass of $Y_2Si_4N_6C$ powder containing no oxygen bond, 5 parts by mass of $MgSiN_2$ powder, and 3 parts by mass of yttria powder were weighed. These materials were pulverized and mixed in a ball mill for 24 hours, using a resin pot and silicon nitride balls, in water as a dispersion medium. The water was weighed before being introduced into the resin pot, so that the concentration of the slurry would be 60 wt %. After the pulverization and mixing, 22 parts by mass of binder was added, and further mixing was performed for 12 hours to obtain a slurry-like composition for shaping. Subsequently, the composition for shaping was subjected to viscosity adjustment using a vacuum defoaming machine (manufactured by Sayama Riken) to prepare a slurry for coating. Thereafter, the viscosity-adjusted composition for shaping was shaped as a sheet by doctor blading to obtain a green sheet having a width of 75 cm and a thickness of 0.42 mm. The physical properties of the obtained green sheet are shown in Table 2.

The green sheets obtained in this manner were placed in the firing container by using a boron nitride powder as a releasing agent, and degreased in dry air at 550° C., whereby a sheet-like degreased compact was obtained.

Thereafter, a square-tubular article of carbon was attached to the plate-like carbon jig with the degreased compact placed thereon and set so as to surround the body periphery as shown in the enlarged view in FIG. 1.

The jigs housing the compacts to be fired were produced sequentially, which were supplied into the continuous firing furnace shown in FIG. 1 to perform continuous firing.

Figure 2:
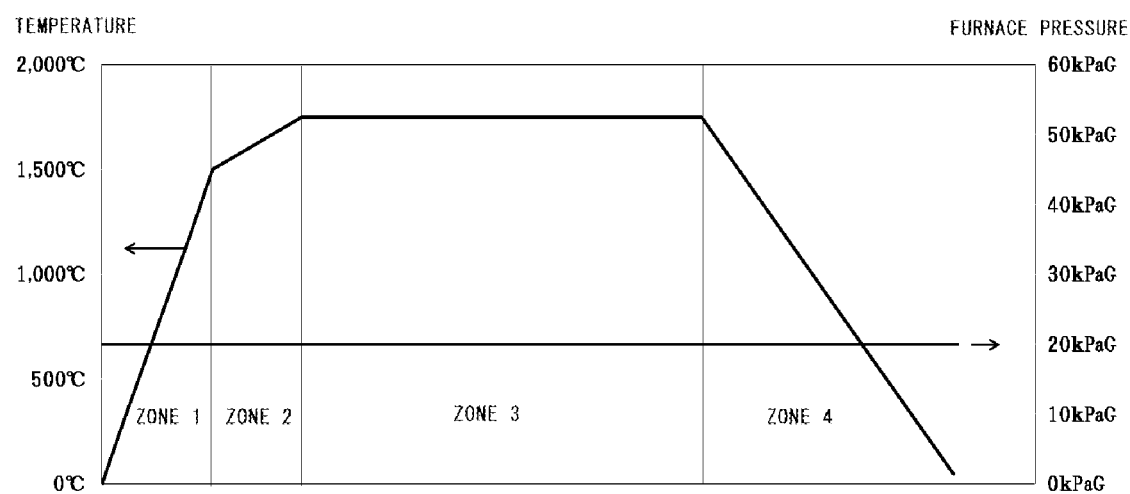
FIG. 2 is a chart showing an example of a temperature profile for the continuous firing furnace of the present invention.

The continuous firing furnace used here is equipped with a heating mechanism 6. The heating mechanism 6 is divided into four zones and placed on the body portion of the firing container 5. In order to obtain the firing profile as shown in FIG. 2, the temperature setting for each zone was programmed in accordance with the conveyance speed. Nitrogen was supplied into the firing container 5, and the pressure was adjusted to 0.02 MPa·G. The compact to be fired, which was placed on the firing jig 2, was carried into the supplying chamber by opening a carry-in door (not shown) of the supplying chamber 11. After closing the carry-in door, the internal space was subjected to nitrogen replacement, and its pressure was adjusted to be substantially equal to that inside the firing container 5. Thereafter, the supplying openable door 3 was got open and the firing jig 2 was supplied by a piston cylinder 10 pushed into the firing container 5.

By repeating the aforementioned operations, the firing jigs travel sequentially in the firing container 5. During the travel, heat was applied to achieve the temperature profile (total required time: 24 hours) as shown in FIG. 2 by controlling the temperature of the each zone in addition to setting of the length of the firing container 5, the number of the divided zones of the heating mechanism 6, and the length of each zone. Here, firing was performed at 1780° C. for 9 hours.

For the firing jig 2 after completion of the firing, the internal space of the ejection chamber 13 was subjected to nitrogen replacement. And after adjusting the pressure to be substantially equal to that inside the firing container 5, the discharging openable door 4 was opened, and the firing jig 2 was transferred into the ejection chamber 13. After that, the discharging openable door 4 was closed, the ejection door 12 was opened to eject the silicon nitride fired compact together with the firing jig, from the ejection chamber 13.

The obtained silicon nitride sintered substrate was blasted with alumina abrasive grains having an average particle diameter of 500 μm by air flow at a pressure of 0.3 MPa, so that the foreign matters on the surface were removed, and then, the respective physical properties were measured. The results are also shown in Table 2.

As for the silicon nitride sintered substrate, an evaluation test for the metallization properties was performed by the aforementioned method. The results are shown in Table 3.

Comparative Example 1

A silicon nitride sintered substrate was obtained in a manner similar to that in Example 1 except that the green sheet used in Example 1 was replaced by a green sheet of the composition as shown in Table 2 and that the firing conditions were modified as shown in Table 2. The physical properties of the sintered compact are shown in Table 2. The results of the evaluation test of the metallization properties are shown in Table 3.

TABLE 2

|  |  |  | Example 1 | Comparative Example 1 |
|---|---|---|---|---|
| Green sheet | Silicon nitride powder (parts by mass) | A | 100 | — |
|  |  | B | — | 100 |
|  | Sintering additive (parts by mass) | $MgSiN_2$ | 5 | — |
|  |  | $Y_2Si_4N_6C$ | 2 | — |
|  |  | $Y_2O_3$ | 3 | 5 |
|  |  | MgO | — | 4 |
|  | Total content of aluminum element (ppm) |  | 500 | 1000 |
|  | Density (g/cm³) |  | 1.95 | 1.82 |
| Firing conditions | Pressure (MPa · G) |  | 0.02 | 0.90 |
|  | Temperature (° C.) |  | 1780 | 1900 |
| Sintered substrate | Physical properties | Relative density (%) | >99% | >99% |
|  |  | Cumulative volume of 1-10 μm pores (ml/cm²) | $2.0 \times 10^{-5}$ | $1.1 \times 10^{-4}$ |
|  |  | Cumulative volume of 1-100 μm pores (ml/cm²) | $4.0 \times 10^{-4}$ | $2.0 \times 10^{-4}$ |
|  |  | Spc (1/mm) | 4.2 | 6.0 |
|  |  | Ra(μm) | 0.4 | 0.6 |
|  |  | Maximum major axis of crystal grains (μm) | 6.8 | 12.4 |
|  |  | Average major axis of crystal grains (μm) | 1.8 | 2.5 |
|  |  | Major axis/minor axis ratio of crystal grains | 1.6 | 5.0 |
|  |  | Aluminum element concentration (ppm) | 200 | 500 |
|  |  | Boron element concentration (% by mass) | Below detection limit | 4.3 |
|  |  | Thermal conductivity (W/mK) | 95 | 78 |
|  |  | Dielectric strength (kV/mm) | 47 | 40 |

TABLE 3

|  |  | Example 1 | | Comparative Example 1 | |
|---|---|---|---|---|---|
|  |  | AMB | DBC | AMB | DBC |
| Number of cycles | 0 | ○ | ○ | ○ | ○ |
|  | 10 | ○ | ○ | ○ | Δ |
|  | 50 | ○ | ○ | x | x |
|  | 100 | ○ | ○ | — | — |
|  | 1000 | ○ | ○ | — | — |

TABLE 3-continued

| | Example 1 | | Comparative Example 1 | |
|---|---|---|---|---|
| | AMB | DBC | AMB | DBC |
| 2000 | ○ | ○ | — | — |
| 3000 | ○ | ○ | — | — |

As can be seen from the results, as for the substrate in Comparative Example 1, due to the large undulations of the surface, it is impossible to fill the undulations with the brazing material by the AMB method, and thus, voids will be formed. Similarly in the DBC technique, the undulations will remain directly as voids. In contrast, in Example 1, the gentle undulations can be easily filled with the brazing materials by the AMB method, and thus, voids will rarely be formed. Similarly less voids may be formed by the DBC method in comparison to the counterpart of Comparative Example.

In this test, delamination at the copper plate end portion was observed visually in 50 cycles in Comparative Example 1. On the other hand, no cracks were formed for the silicon nitride sintered substrate of Example 1 even after 3000 cycles, namely, a favorable result was obtained.

The invention claimed is:

1. A silicon nitride sintered substrate that is sintered and remains unpolished, wherein a cumulative volume of pores having a diameter in a range of 1 to 10 μm is not more than $7.0 \times 10^{-5}$ mL/cm² in a measurement by a mercury porosimetry.

2. The silicon nitride sintered substrate according to claim 1, wherein Ra of the surface is not more than 0.6 μm and arithmetic mean peak curvature (Spc) of a peak is not more than 4.5 [1/mm].

3. The silicon nitride sintered substrate according to claim 1, wherein crystal grains that are observed in a viewing field range in the depth of not less than 50 μm from the surface in a micrograph of a randomly selected cross section taken with a 2000× scanning electron microscope have a maximum major axis of not more than 10.0 μm, an average major axis in a range of 1.5 to 2.0 μm, and a ratio of major axis to minor axis (major axis/minor axis) in a range of 1 to 5.

4. The silicon nitride sintered substrate according to claim 1, wherein the thickness is in a range of 0.1 to 1.5 mm.

5. A laminated substrate for semiconductor, comprising the silicon nitride sintered substrate according to claim 1.

6. The silicon nitride sintered substrate according to claim 2, wherein crystal grains that are observed in a viewing field range in the depth of not less than 50 μm from the surface in a micrograph of a randomly selected cross section taken with a 2000× scanning electron microscope have a maximum major axis of not more than 10.0 μm, an average major axis in a range of 1.5 to 2.0 μm, and a ratio of major axis to minor axis (major axis/minor axis) in a range of 1 to 5.

7. The silicon nitride sintered substrate according to claim 2, wherein the thickness is in a range of 0.1 to 1.5 mm.

8. The silicon nitride sintered substrate according to claim 3, wherein the thickness is in a range of 0.1 to 1.5 mm.

9. A laminated substrate for semiconductor, comprising the silicon nitride sintered substrate according to claim 2.

10. A laminated substrate for semiconductor, comprising the silicon nitride sintered substrate according to claim 3.

11. A laminated substrate for semiconductor, comprising the silicon nitride sintered substrate according to claim 4.

* * * * *